(12) United States Patent
Furuya et al.

(10) Patent No.: US 6,344,082 B1
(45) Date of Patent: Feb. 5, 2002

(54) FABRICATION METHOD OF SI NANOCRYSTALS

(75) Inventors: Kazuo Furuya; Masaki Takeguchi; Kazuhiro Yoshihara, all of Ibaraki (JP)

(73) Assignee: Japan Agency of Industrial Science and Technology as represented by Director General of National Research Institute for Metals, Ibaraki (JP)

( * ) Notice: Subject to any disclaimer, the term of this patent is extended or adjusted under 35 U.S.C. 154(b) by 0 days.

(21) Appl. No.: 09/342,622

(22) Filed: Jun. 29, 1999

(30) Foreign Application Priority Data

Jul. 1, 1998 (JP) .............................. 10-186637

(51) Int. Cl.⁷ ............................ C30B 1/02; C30B 29/06
(52) U.S. Cl. ............................. 117/7; 117/8; 117/905; 117/942
(58) Field of Search ........................ 117/7, 8, 905, 117/942

(56) References Cited

U.S. PATENT DOCUMENTS 4,877,650 A * 10/1989 Matsuyama et al. ..... 427/248.1

OTHER PUBLICATIONS

Takeguchi, Masaki et al., "Fabrication and analysis of the nanometer–sized structure of silicon by ultrahigh vacuum field emission transmission electron microscope", Applied Surface Science 146: 257–261, May 1999.*

Roditchev et al, "Photoluminescence of Si nanocrystals created by heavy ion irradiation of amorphous SiO films", Japanese Journal of Applied Physics, Supplemental vol. 34 1–4 pp. 34–6, abs only, 1994.*

* cited by examiner

*Primary Examiner*—Robert Kunemund
(74) *Attorney, Agent, or Firm*—Wenderoth, Lind & Ponack, L.L.P.

(57) ABSTRACT

Si nanocrystals are formed by irradiating $SiO_2$ substrates with electron beams at a temperature of 400° C. or higher, thereby causing electron-stimulated decomposition reaction. As a result of the said reaction, single crystalline Si nanostructures are fabricated on the $SiO_2$ substrate with good size and positional controllability.

16 Claims, 2 Drawing Sheets

FABRICATION METHOD OF SI NANOCRYSTALS

BACKGROUND OF THE INVENTION

1. Field of the Invention

The present invention concerns a method of fabricating Si nanocrystals. In particular, it relates to Si nanostructures which are useful in applications such as, semiconductor quantum dots, nonlinear optical devices, and quantum wave interference materials, as well as to a method of manufacturing such nanocrystalline structures.

2. Description of the Related Art

Prior methods of fabricating semiconductor superlattice structures involve application of vacuum evaporation using MBE or CVD to prepare a one-layered structure, or application of lithography and etching technology to prepare two-dimensional or three-dimensional structures. However, in the former method, positional control of its arrangement is difficult, and in recent years, a method to vacuum evaporate fine particles at random and then forming a regular arrangement on the substrate through a self-restoration process has been considered. Yet, this method has not yet been established as a practical technique. On the other hand, the latter method allows positional control, but can only provide structures of which the minimum size is in the order of ten nm, while finer structures are demanded.

For some years, in order to apply lithography/etching technology in fabricating finer structures, the use of focused electron beam has been considered.

For example, decomposition of $SiO_2$ by irradiating focused electron beam to precipitate Si on its surface, has been known as the electron-stimulated desorption mechanism (ESD) (M. L. Knotek and P. J. Feibelman, *Surf. Sci.*, 90, 78 (1979)). Also, in recent years, a study has been reported on preparing amorphous Si particles 2 nm in size by ESD at room temperature, utilizing focused electron beam from a field emission electron microscope, and arranging them on amorphous $SiO_2$ with positional control (G. S. Chen, C. B. Boothroyd and C. J. Humphreys, *Appl. Phys. Lett.*, 62, 1949 (1993)). However, no detailed studies have been made on the formation of Si nanocrystals by ESD, and the Si that had been manufactured in the latter study was, actually, merely of an amorphous structure. The quantum size effect in a superlattice is remarkable in crystals but small in the amorphous state, because the band structure of amorphous particles does not depend on size, unlike in crystalline materials, and quantum size effect can not be expected.

SUMMARY OF THE INVENTION

In view of the above situation, the present invention has been invented as a result of intensive study, and its main object is to provide a novel method which allows the formation of single crystalline Si nanostructures by the irradiation of electron beams, which also allows excellent size and position controllability.

Another object of the present invention is to provide Si nanostructures not known so far, obtained by using the method described above.

BRIEF DESCRIPTION OF THE DRAWINGS

The foregoing and other objects, features and advantages of the present invention will be better understood from the following detailed description, taken in conjunction with the accompanying drawings, in which.

DESCRIPTION OF THE PREFERRED EMBODIMENTS

According to the present invention, the method by which single crystalline Si nanocrystals are fabricated, is by an electron-stimulated decomposition reaction (ESD), generated by irradiating electron beams on the surface of a $SiO_2$ substrate at a temperature of 400° C. or higher.

If the temperature is lower than 400° C., formation of Si nanocrystals with good controllability becomes difficult. Single crystalline Si nanocrystals with sizes of 5 nm or less may be obtained by the ESD mechanism only at temperatures equal to or higher than 400° C.

Also, the $SiO_2$ substrate used in this method may be quartz amorphized by electrons prior to ESD.

A preferable embodiment would be, for example, (1) to use quartz (crystalline $SiO_2$) as a substrate and turn it amorphous by irradiating it with electron beams, and (2) while heating the substrate at 400° C. or higher, irradiate it with electron beams focused to about 1 to 10 nm at an intensity of $2\times10^8$ C $m^{-2}s^{-1}$ or higher, for 5 seconds or more under ultra-high vacuum, preferably below $1\times10^{-7}$ Pa, to attain a dose of $1\times10^9$ C $m^{-2}s^{-1}$, thereby decomposing $SiO_2$ by the ESD mechanism and crystallizing Si as single crystals of 5 nm or less in size. The energy of the electron beams may be 100 keV or lower. The size of the Si nanocrystals can be controlled by the time and the intensity of the irradiation, and arbitrary patterns can be manufactured by spot scanning or line scanning of the electron beam.

The electron beam intensity and the temperature upon turning the quartz amorphous, are not necessarily precise. The procedure may be performed at room temperature or at an elevated temperature. The beam intensity for amorphization may be set at the same level as that commonly used in observation of $1\times10^4$ C $m^{-2}s^{-1}$ or higher. However, when performing ESD, an intense electron beam of $2\times10^8$ C $m^{-2}s^{-1}$ or higher is preferred, and having a temperature of 400° C. or higher, and an ultra-high vacuum condition becomes important. The desired degree of vacuum is $10^{-7}$ Pa or less.

The present invention is to be more clearly understood with reference to the following example. However, the example is merely illustrative in nature and should not be construed to limit the spirit and scope of the claims.

EXAMPLE

Figure 1:
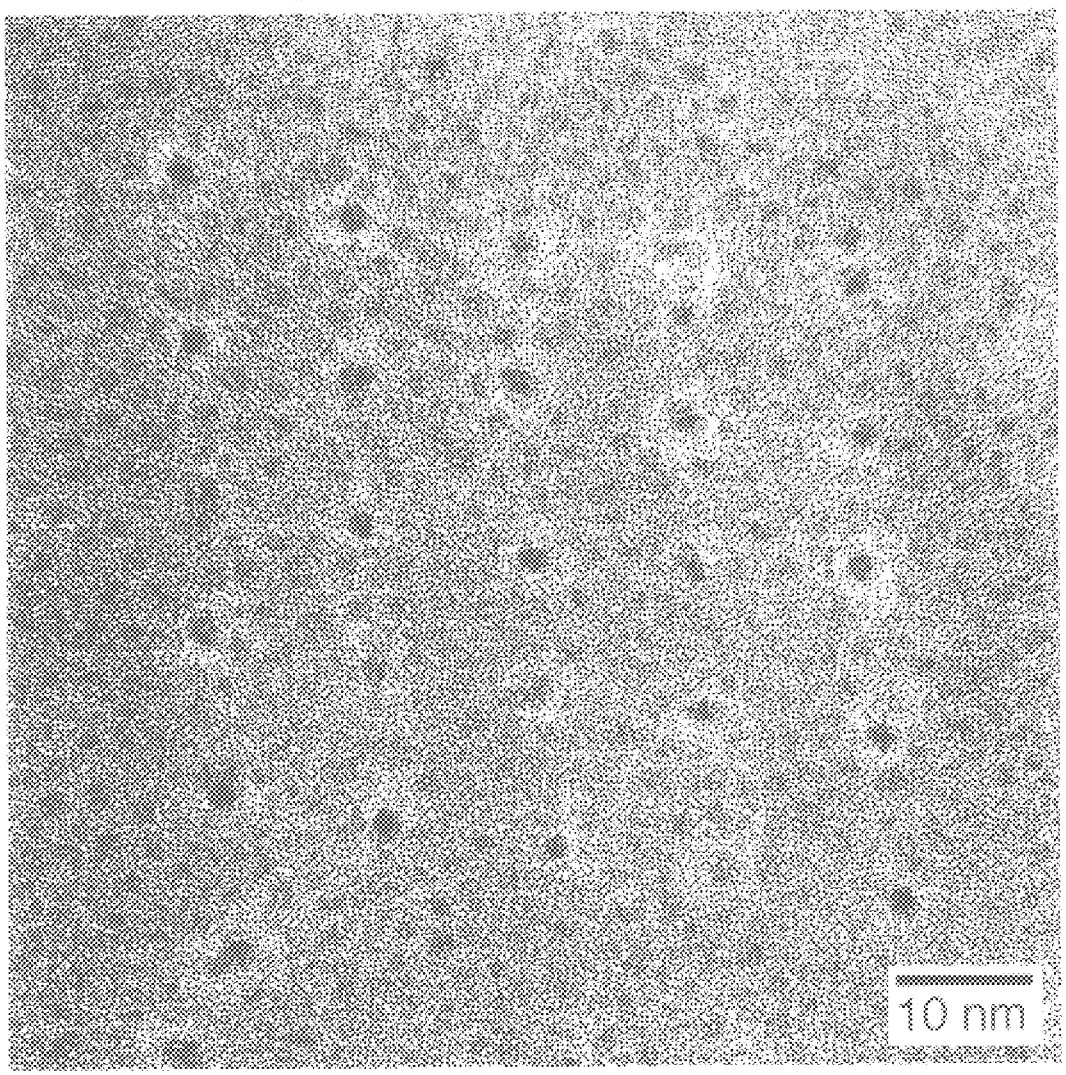
FIG. 1 is an electron microscopic photograph, as a substitute for a drawing, illustrating the state of two-dimensional arrangement of Si nanocrystals obtained as a result of the irradiation of focused electron beams. Si nanocrystals are observed in a two-dimensional arrangement, with five spots in the vertical direction and five spots in the horizontal directions; 25 nanocrystals in total.

The energy of the electron beam was set at 100 keV and a thin film of $SiO_2$ single crystals (quartz) was made amorphous by a relatively weak irradiation of about $2\times10^7$ C m$^{-2}$s$^{-1}$. Then by using a field emission transmission type electron microscope, the electron beam were focused to about 3 nm at a temperature of 600° C. in ultra-high vacuum of $2\times10^{-8}$ Pa. The beam intensity was increased to $2\times10^8$ C m$^{-2}$s$^{-1}$ or higher, and spot scanning was applied. The beam was irradiated on five spots in the vertical, and five spots in the horizontal direction, 25 spots in total, for 5 seconds each, so that the dose applied to each of the spots was $1\times10^9$ C m$^{-2}$s$^{-1}$ or higher. Si nanostructures shown in FIG. 1 were obtained by the ESD mechanism. The size of each Si single nanocrystal was 2 nm and the distance between each nanocrystals from its vertically or horizontally neighboring nanocrystals was 10 nm. Contrast of nanocrystals can be confirmed clearly.

Figure 2:
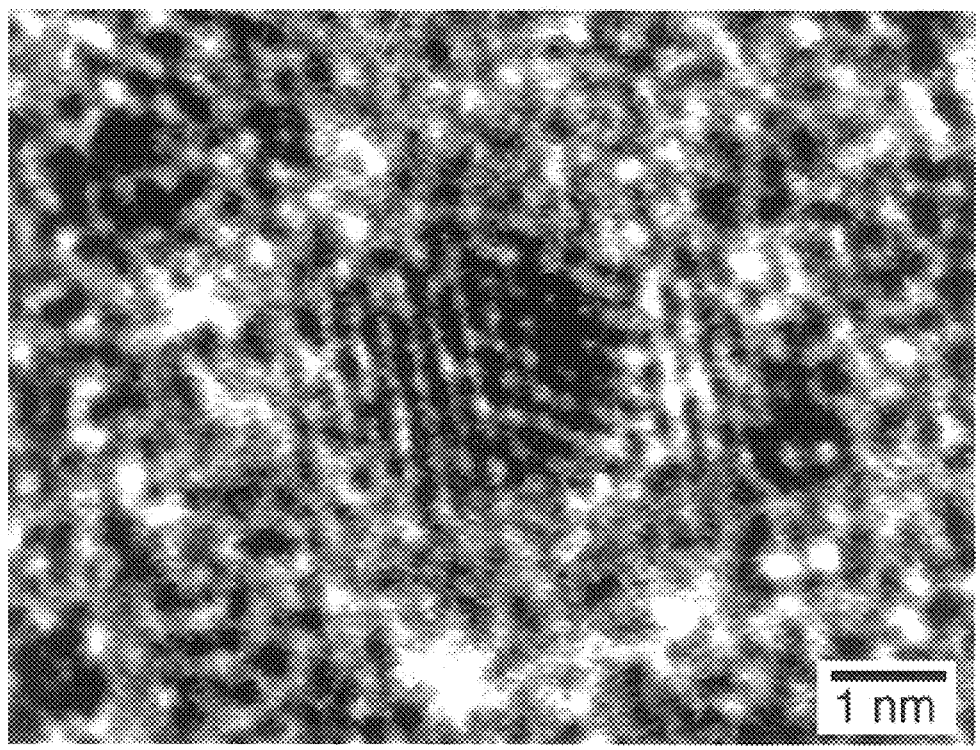
FIG. 2 is an electron microscopic photograph, as a substitute for a drawing, showing one Si nanocrystals. A characteristic pattern of the crystal structure can be observed. The lack of distortion in the lattice suggests that the nanocrystal is a single crystal.

FIG. 2 is an enlarged photograph of the Si nanocrystal thus manufactured. A region of 2 nm in size is changed to a substantially circular shape and a lattice fringe (which shows the distance between atom arranged regularly in the crystal) can be observed. Furthermore, since distortion in the lattice fringe is not observed, the nanocrystal can be judged to be a single crystal.

Figure 3:
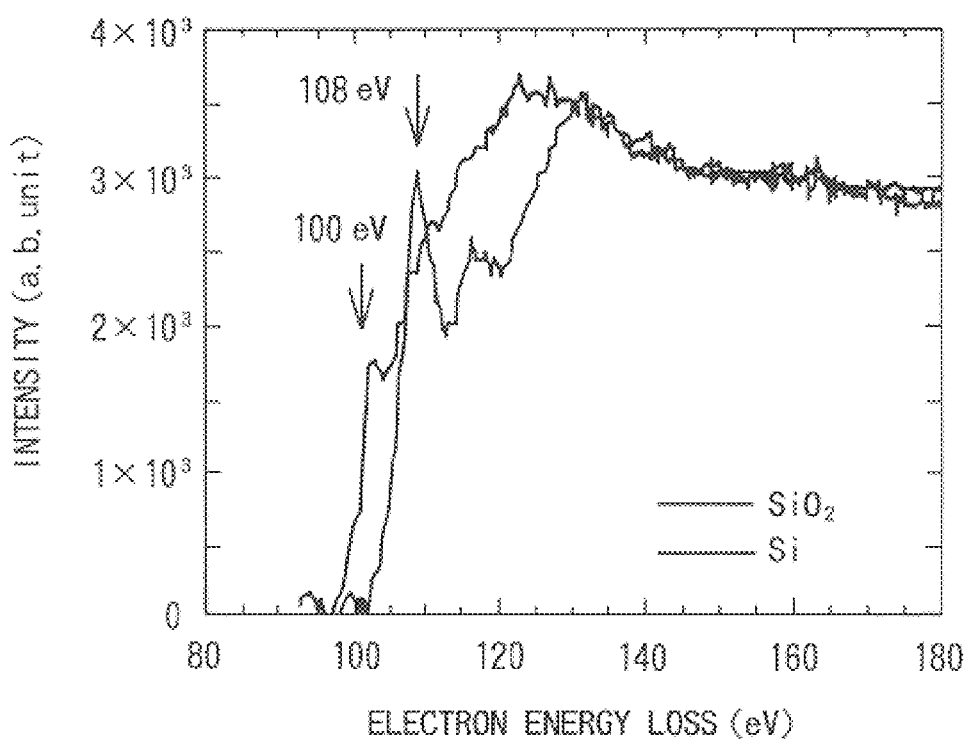
FIG. 3 is the electron energy loss spectra obtained for a precipitated nanocrystal and the $SiO_2$ at its periphery. By observing the L-edge of Si, composition of crystals can be analyzed, and the appearance of shoulders at 100 eV and at 108 eV suggest that the precipitated particles can be identified as Si.

The composition of the nanocrystals were analyzed by using electron energy loss spectrometer (EELS) and the results are shown in FIG. 3. Observation of the L-edge shape of Si, for the nanocrystal shows that the edge has a shoulder at about 100 eV, indicating that the crystal is composed of elemental Si alone. On the other hand, the L-edge obtained from the periphery of the nanocrystal was of a shape having a shoulder at 108 eV which is inherent to SiO$_2$. Also, the size of the nanocrystal increased with the increase in beam diameter and irradiation time.

The results described above indicate that an arrangement of Si nanocrystals can be formed with size and position controlled, on SiO$_2$ by using focused electron beam.

As has been described above specifically, it is possible, in accordance with the present invention, to fabricate Si quantum dot three-dimensional superlattice structures. To control the electron state by the semiconductor superlattice structure, a periodicity of a size of 5 to 10 nm or less is required, and can be attained by the present invention. It is considered that the invention is applicable as, for example, semiconductor quantum dots, nonlinear optical devices, and quantum wave interference materials.

In addition, the following advantageous effects can also be attained.

(1) Since high speed transistors and optical devices can be developed, high-speed and size-reduced electronic instruments ca be obtained.

(2) Superlattice can be manufactured without using expensive materials, as in compound semiconductors such as GaAs.

(3) Use of vacuum evaporators such as MBE or CVD will no longer be necessary.

What is claimed is:

1. A method of fabricating a Si nanostructure comprising:
   heating an SiO$_2$ substrate at a temperature of 400° C. or higher,
   focusing an electron beam to a diameter of 5 nm or less, and
   irradiating a single spot on the heated SiO$_2$ substrate with the focused electron beam having an intensity of $2\times10^8$ Cm$^{-2}$s$^{-1}$ or higher under ultra-high vacuum to form a single Si nanocrystal on the single spot through an electron-stimulated decomposition reaction.

2. The method according to claim 1, wherein the single Si nanocrystal has a size of 5 nm or less.

3. A method of fabricating a Si nanostructure comprising:
   irradiating a crystalline SiO$_2$ substrate with an electron beam to turn said crystalline SiO$_2$ substrate into an amorphous SiO$_2$ substrate,
   heating the amorphous SiO$_2$ substrate at a temperature of 400° C. or higher,
   focusing the electron beam to a diameter of 5 nm or less, and
   irradiating a single spot on the heated amorphous SiO$_2$ substrate with the focused electron beam having an intensity of $2\times10^8$ Cm$^{-2}$s$^{-1}$ or higher to form a single Si nanocrystal on the single spot through the electron-simulated decomposition reaction.

4. The method according to claim 3, wherein the single Si nanocrystal has a size of 5 nm or less.

5. A method of fabricating a Si nanostructure comprising:
   heating an SiO$_2$ substrate at a temperature of 400° C. or higher,
   focusing an electron beam to a diameter of 5 nm or less, and
   irradiating a plurality of spots, each positioned in a two-dimensional arrangement, on the heated SiO$_2$ substrate with the focused electron beam having an intensity of $2\times10^8$ Cm$^{-2}$s$^{-1}$ or higher to form a plurality of single Si nanocrystals, each isolated from each other, on the plurality of spots in the two-dimensional arrangement through an electron-stimulated decomposition reaction.

6. The method according to claim 5, wherein each single Si nanocrystal in the plurality of single Si nanocrystals has a size of 5 nm or less and the distance between each of the single Si nanocrystals in the plurality of single Si nanocrystals is in the range of 5 to 10 nm.

7. A method of fabricating a Si nanostructure comprising:
   irradiating a crystalline SiO$_2$ substrate with an electron beam to turn said crystalline SiO$_2$ substrate into an amorphous SiO$_2$ substrate,
   heating the amorphous SiO$_2$ substrate at a temperature of 400° C. or higher,
   focusing the electron beam to a diameter of 5 nm or less, and
   irradiating a plurality of spots, each positioned in a two-dimensional arrangement, on the heat amorphous SiO$_2$ substrate with the focused electron beam having an intensity of $2\times10^8$ Cm$^{-2}$s$^{-1}$ or higher to form a plurality of single Si nanocrystals, each isolated from each other, on the plurality of spots in the two-dimensional arrangement through an electron-stimulated decomposition reaction.

8. The method according to claim 7, wherein each single Si nanocrystal in the plurality of single Si nanocrystals has a size of 5 nm or less and the distance between each of the single Si nanocrystals in the plurality of single Si nanocrystals is in the range of 5 to 10 nm.

9. The method according to claim 1, wherein the focused electron beam has a dose of $1\times10^9$ Cm$^{-2}$s$^{-1}$ or higher.

10. The method according to claim 2, wherein the focused electron beam has a dose of $1\times10^9$ Cm$^{-2}$s$^{-1}$ or higher.

11. The method according to claim 3, wherein the focused electron beam has a dose of $1\times10^9$ Cm$^{-2}$s$^{-1}$ or higher.

12. The method according to claim 4, wherein the focused electron beam has a dose of $1\times10^9$ Cm$^{-2}$s$^{-1}$ or higher.

13. The method according to claim 5, wherein the focused electron beam has a dose of $1\times10^9$ Cm$^{-2}$s$^{-1}$ or higher.

14. The method according to claim 6, wherein the focused electron beam has a dose of $1\times10^9$ $Cm^{-2}s^{-1}$ or higher.

15. The method according to claim 7, wherein the focused electron beam has a dose of $1\times10^9$ $Cm^{-2}s^{-1}$ or higher.

16. The method according to claim 8, wherein the focused electron beam has a dose of $1\times10^9$ $Cm^{-2}s^{-1}$ or higher.

* * * * *